(12) United States Patent
Varma et al.

(10) Patent No.: US 9,547,027 B2
(45) Date of Patent: Jan. 17, 2017

(54) DYNAMICALLY MEASURING POWER CONSUMPTION IN A PROCESSOR

(75) Inventors: Ankush Varma, Hillsboro, OR (US);
Krishnakanth V. Sistla, Beaverton, OR (US); Martin T. Rowland, Beaverton, OR (US); Vivek Garg, Folsom, CA (US); James S. Burns, Cupertino, CA (US)

(73) Assignee: Intel Corporation, Santa Clara, CA (US)

(*) Notice: Subject to any disclaimer, the term of this patent is extended or adjusted under 35 U.S.C. 154(b) by 451 days.

(21) Appl. No.: 13/996,266

(22) PCT Filed: Mar. 30, 2012

(86) PCT No.: PCT/US2012/031464
§ 371 (c)(1),
(2), (4) Date: Jun. 20, 2013

(87) PCT Pub. No.: WO2013/147849
PCT Pub. Date: Oct. 3, 2013

(65) Prior Publication Data
US 2014/0195828 A1    Jul. 10, 2014

(51) Int. Cl.
*G06F 1/00* (2006.01)
*G01R 21/133* (2006.01)
(Continued)

(52) U.S. Cl.
CPC ............... *G01R 21/133* (2013.01); *G06F 1/26* (2013.01); *G06F 1/3203* (2013.01); *G06F 1/324* (2013.01);
(Continued)

(58) Field of Classification Search
CPC ........ G06F 1/3203; G06F 1/26; G06F 1/3206; G06F 1/324; Y02B 60/1217
See application file for complete search history.

(56) References Cited

U.S. PATENT DOCUMENTS 5,163,153 A   11/1992   Cole et al.
5,522,087 A   5/1996    Hsiang
(Continued)

FOREIGN PATENT DOCUMENTS

CN   1739080     2/2006
CN   101901033   12/2010
(Continued)

OTHER PUBLICATIONS

Intel Developer Forum, IDF2010, Opher Kahn, et al., "Intel Next Generation Microarchitecture Codename Sandy Bridge: New Processor Innovations," Sep. 13, 2010, 58 pages.
(Continued)

*Primary Examiner* — Mohammed Rehman
*Assistant Examiner* — Gayathri Sampath
(74) *Attorney, Agent, or Firm* — Trop, Pruner & Hu, P.C.

(57) ABSTRACT

In one embodiment, the present invention includes a processor having multiple cores to independently execute instructions, a first sensor to measure a first power consumption level of the processor based at least in part on events occurring on the cores, and a hybrid logic to combine the first power consumption level and a second power consumption level. Other embodiments are described and claimed.

15 Claims, 10 Drawing Sheets

(51) Int. Cl.
*G06F 1/32* (2006.01)
*G06F 1/26* (2006.01)

(52) U.S. Cl.
CPC .......... *G06F 1/3206* (2013.01); *G06F 1/3243* (2013.01); *G06F 1/3296* (2013.01); *Y02B 60/1217* (2013.01); *Y02B 60/1239* (2013.01); *Y02B 60/1285* (2013.01)

(56) References Cited

U.S. PATENT DOCUMENTS

| | | |
|---|---|---|
| 5,590,341 A | 12/1996 | Matter |
| 5,621,250 A | 4/1997 | Kim |
| 5,931,950 A | 8/1999 | Hsu |
| 6,564,328 B1 * | 5/2003 | Grochowski ......... G06F 1/3203 712/E9.049 |
| 6,748,546 B1 | 6/2004 | Mirov et al. |
| 6,792,392 B1 | 9/2004 | Knight |
| 6,823,516 B1 | 11/2004 | Cooper |
| 6,829,713 B2 | 12/2004 | Cooper et al. |
| 6,996,728 B2 | 2/2006 | Singh |
| 7,010,708 B2 | 3/2006 | Ma |
| 7,043,649 B2 | 5/2006 | Terrell |
| 7,093,147 B2 | 8/2006 | Farkas et al. |
| 7,111,179 B1 | 9/2006 | Girson et al. |
| 7,194,643 B2 | 3/2007 | Gonzalez et al. |
| 7,272,730 B1 | 9/2007 | Acquaviva et al. |
| 7,412,615 B2 | 8/2008 | Yokota et al. |
| 7,434,073 B2 | 10/2008 | Magklis |
| 7,437,270 B2 | 10/2008 | Song et al. |
| 7,454,632 B2 | 11/2008 | Kardach et al. |
| 7,529,956 B2 | 5/2009 | Stufflebeam |
| 7,539,885 B2 | 5/2009 | Ma |
| 7,730,340 B2 | 6/2010 | Hu et al. |
| 2001/0044909 A1 | 11/2001 | Oh et al. |
| 2002/0194509 A1 | 12/2002 | Plante et al. |
| 2003/0061383 A1 | 3/2003 | Zilka |
| 2003/0065960 A1 * | 4/2003 | Rusu .................... G06F 1/3203 713/300 |
| 2004/0064752 A1 | 4/2004 | Kazachinsky et al. |
| 2004/0098560 A1 | 5/2004 | Storvik et al. |
| 2004/0123170 A1 * | 6/2004 | Tschanz ................ G06F 1/3203 713/320 |
| 2004/0139356 A1 | 7/2004 | Ma |
| 2004/0268166 A1 | 12/2004 | Farkas et al. |
| 2005/0022038 A1 | 1/2005 | Kaushik et al. |
| 2005/0033881 A1 | 2/2005 | Yao |
| 2005/0132238 A1 | 6/2005 | Nanja |
| 2005/0210905 A1 | 9/2005 | Burns et al. |
| 2006/0050670 A1 | 3/2006 | Hillyard et al. |
| 2006/0053326 A1 | 3/2006 | Naveh |
| 2006/0059286 A1 | 3/2006 | Bertone et al. |
| 2006/0069936 A1 | 3/2006 | Lint et al. |
| 2006/0090086 A1 | 4/2006 | Rotem et al. |
| 2006/0117202 A1 | 6/2006 | Magklis et al. |
| 2006/0184287 A1 | 8/2006 | Belady et al. |
| 2007/0005995 A1 | 1/2007 | Kardach et al. |
| 2007/0016814 A1 | 1/2007 | Rusu et al. |
| 2007/0016817 A1 | 1/2007 | Albonesi et al. |
| 2007/0079294 A1 | 4/2007 | Knight |
| 2007/0106827 A1 | 5/2007 | Boatright et al. |
| 2007/0156992 A1 | 7/2007 | Jahagirdar |
| 2007/0214342 A1 | 9/2007 | Newburn |
| 2007/0239398 A1 | 10/2007 | Song et al. |
| 2007/0245163 A1 | 10/2007 | Lu et al. |
| 2008/0028240 A1 | 1/2008 | Arai et al. |
| 2008/0082844 A1 * | 4/2008 | Ghiasi ................... G06F 1/3203 713/323 |
| 2008/0168287 A1 * | 7/2008 | Berry ..................... G06F 1/266 713/323 |
| 2008/0244294 A1 * | 10/2008 | Allarey ................ G06F 1/3203 713/320 |
| 2008/0250260 A1 | 10/2008 | Tomita |
| 2009/0006871 A1 | 1/2009 | Liu et al. |
| 2009/0150695 A1 | 6/2009 | Song et al. |
| 2009/0150696 A1 | 6/2009 | Song et al. |
| 2009/0158061 A1 | 6/2009 | Schmitz et al. |
| 2009/0158067 A1 | 6/2009 | Bodas et al. |
| 2009/0172375 A1 | 7/2009 | Rotem et al. |
| 2009/0172428 A1 | 7/2009 | Lee |
| 2009/0235105 A1 | 9/2009 | Branover et al. |
| 2010/0083009 A1 * | 4/2010 | Rotem .................. G06F 1/3203 713/300 |
| 2010/0115293 A1 | 5/2010 | Rotem et al. |
| 2010/0115309 A1 | 5/2010 | Carvalho et al. |
| 2010/0146513 A1 | 6/2010 | Song |
| 2010/0191997 A1 | 7/2010 | Dodeja et al. |
| 2010/0332877 A1 | 12/2010 | Yarch et al. |
| 2011/0154090 A1 | 6/2011 | Dixon et al. |
| 2012/0023345 A1 * | 1/2012 | Naffziger .............. G06F 1/3206 713/320 |
| 2012/0079290 A1 | 3/2012 | Kumar |
| 2012/0144217 A1 | 6/2012 | Sistla |
| 2012/0204042 A1 | 8/2012 | Sistla |
| 2012/0246506 A1 | 9/2012 | Knight |
| 2013/0061064 A1 | 3/2013 | Ananthakrishnan et al. |
| 2013/0080803 A1 | 3/2013 | Ananthakrishnan et al. |
| 2013/0080804 A1 | 3/2013 | Ananthakrishnan et al. |
| 2013/0111120 A1 | 5/2013 | Ananthakrishnan et al. |
| 2013/0111121 A1 | 5/2013 | Ananthakrishnan et al. |
| 2013/0111226 A1 | 5/2013 | Ananthakrishnan et al. |
| 2013/0111236 A1 | 5/2013 | Ananthakrishnan et al. |

FOREIGN PATENT DOCUMENTS

| | | |
|---|---|---|
| CN | 101937265 | 1/2011 |
| EP | 1 282 030 A1 | 5/2003 |
| WO | 2008083906 | 7/2008 |

OTHER PUBLICATIONS

Spec-Power and Performance, Design Overview V1.10, Standard Performance Information Corp., Oct. 21, 2008, 6 pages.

Intel Technology Journal, "Power and Thermal Management in the Intel Core Duo Processor," May 15, 2006, pp. 109-122.

Anoop Iyer, et al., "Power and Performance Evaluation of Globally Asynchronous Locally Synchronous Processors," 2002, pp. 1-11.

Greg Semeraro, et al., "Hiding Synchronization Delays in a GALS Processor Microarchitecture," 2004, pp. 1-13.

Joan-Manuel Parcerisa, et al., "Efficient Interconnects for Clustered Microarchitectures," 2002, pp. 1-10.

Grigorios Magklis, et al., "Profile-Based Dynamic Voltage and Frequency Scalling for a Multiple Clock Domain Microprocessor," 2003, pp. 1-12.

Greg Semeraro, et al., "Dynamic Frequency and Voltage Control for a Multiple Clock Domain Architecture," 2002, pp. 1-12.

Greg Semeraro, "Energy-Efficient Processor Design Using Multiple Clock Domains with Dynamic Voltage and Frequency Scaling," 2002, pp. 29-40.

Diana Marculescu, "Application Adaptive Energy Efficient Clustered Architectures," 2004, pp. 344-349.

L. Benin!, et al., "System-Level Dynamic Power Management," 1999, pp. 23-31.

Ravindra Jejurikar, et al., "Leakage Aware Dynamic Voltage Scaling for Real-Time Embedded Systems," 2004, pp. 275-280.

Ravindra Jejurikar, et al., "Dynamic Slack Reclamation With Procrastination Scheduling in Real-Time Embedded Systems," 2005, pp. 13-17.

R. Todling, et al., "Some Strategies for Kalman Filtering and Smoothing," 1996, pp. 1-21.

R.E. Kalman, "A New Approach to Linear Filtering and Prediction Problems," 1960, pp. 1-12.

International Application No. PCT/US2012/028865, filed Mar. 13, 2012, entitled "Providing Efficient Turbo Operation of a Processor," by Intel Corporation.

International Application No. PCT/US2012/028902, filed Mar. 13, 2012, entitled "Dynamically Controlling Interconnect Frequency in a Processor," by Intel Corporation.

(56) References Cited

OTHER PUBLICATIONS

International Application No. PCT/US2012/028876, filed Mar. 13, 2012, entitled "Dynamically Computing an Electrical Design Point (EDP) for a Multicore Processor," by Intel Corporation.
U.S. Appl. No. 13/600,568, filed Aug. 31, 2012, entitled, "Configuring Power Management Functionality in a Processor," by Malini K. Bhandaru, et al.
International Searching Authority, "Notification of Transmittal of the International Search Report and the Written Opinion of the International Searching Authority," mailed Nov. 16, 2012, in International application No. PCT/US2012/031464.
State Intellectual Property Office, P.R. China, Office Action mailed Jan. 14, 2016, in Chinese Patent Application No. 201280072149.X.
State Intellectual Property Office of the People's Republic of China, Second Office Action mailed Jun. 21, 2016 in Chinese Patent Application No. 201280072149.X.

\* cited by examiner

DYNAMICALLY MEASURING POWER CONSUMPTION IN A PROCESSOR

TECHNICAL FIELD

The field relates to semiconductor devices for use in a variety of systems.

BACKGROUND

Advances in semiconductor processing and logic design have permitted an increase in the amount of logic that may be present on integrated circuit devices. As a result, computer system configurations have evolved from a single or multiple integrated circuits in a system to multiple hardware threads, multiple cores, multiple devices, and/or complete systems on individual integrated circuits. Additionally, as the density of integrated circuits has grown, the power requirements for computing systems (from embedded systems to servers) have also escalated. Furthermore, software inefficiencies, and its requirements of hardware, have also caused an increase in computing device energy consumption. In fact, some studies indicate that computing devices consume a sizeable percentage of the entire electricity supply for a country, such as the United States of America. As a result, there is a vital need for energy efficiency and conservation associated with integrated circuits. These needs will increase as servers, desktop computers, notebooks, ultrabooks, tablets, mobile phones, processors, embedded systems, etc. become even more prevalent (from inclusion in the typical computer, automobiles, and televisions to biotechnology).

Power management for integrated circuits such as processors (used in both server and client systems) depends on accurate measurements of estimates of current processor power consumption. Various components of a processor may have their voltage and frequency modulated to stay within specified power limits. Since exceeding a power constraint is undesirable, processors are tuned to always stay under the power limit. Errors in power measurement are accounted for as a guardband, resulting in reduced power being available for processor performance.

Consider a processor that has a 100 watt (W) power limit, also referred to as a thermal design power (TDP), and a +/−5% error in power measurement. Since the processor must stay below its power limit, it caps power when a power consumption of 95 W is measured, making 5 W unavailable for use because it is reserved as a guardband. The size of this guardband is directly proportional to the amount of the error. These guardbands thus reduce available power. Further, inaccuracies of different types of power monitors can vary at low and high loads.

DETAILED DESCRIPTION

Embodiments may be used to provide a power measurement for a processor that is highly accurate at all load levels of the processor. To this end, embodiments can obtain information both from a digital power meter and a voltage regulator-based current sensor to determine power consumption levels from such sensor information. More specifically, embodiments may generate a combined or hybrid power measurement based on sensor information obtained from these multiple power sensors. In this way, a more accurate power measurement can be obtained. Then based on this accurate power measurement, a greater power head room is realized. Thus based on this power information, a processor may be controlled to operate at higher operating frequencies and/or voltages to realize greater performance within a given power budget.

Figure 1:
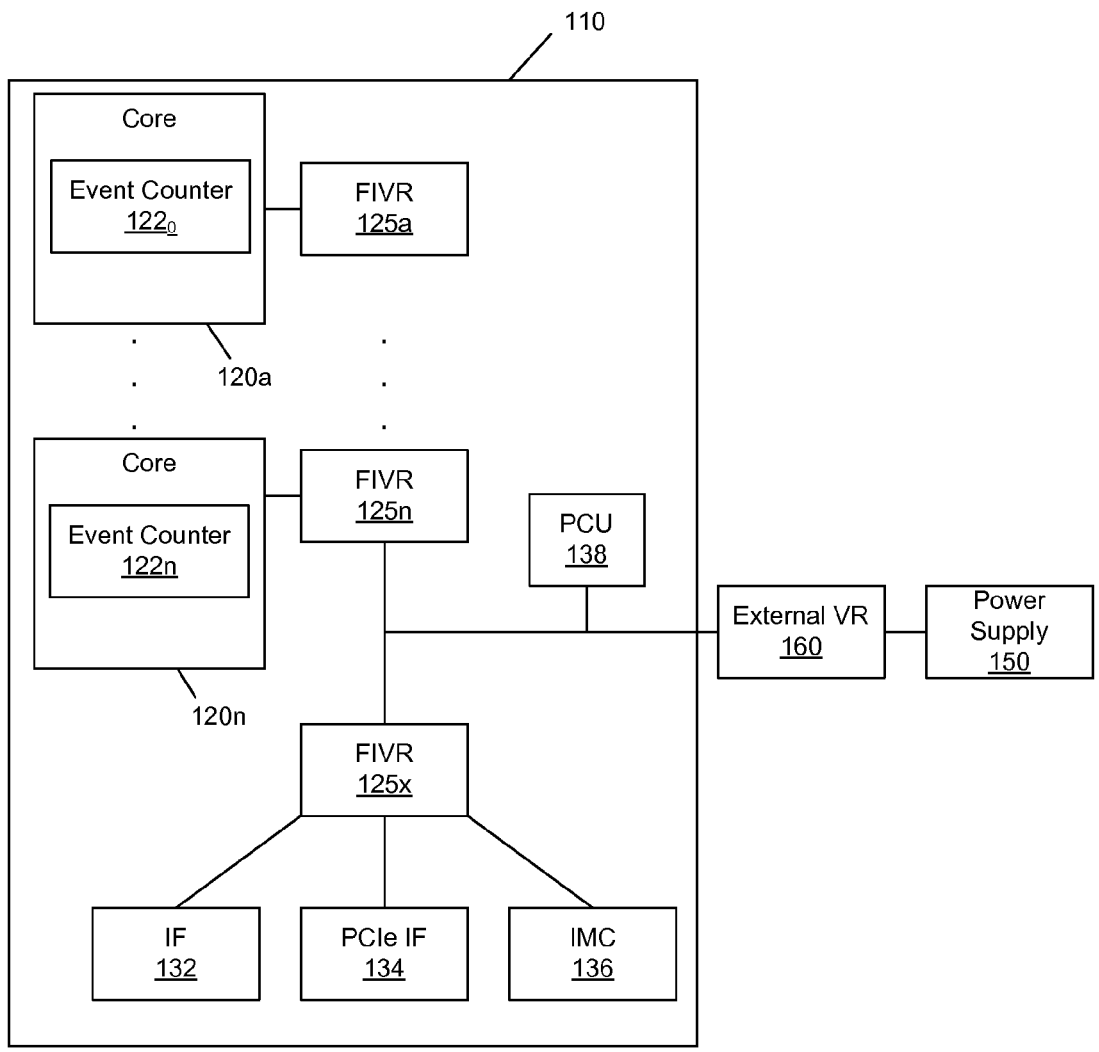
FIG. 1 is a block diagram of a system in accordance with one embodiment of the present invention.

Referring now to FIG. 1, shown is a block diagram of a portion of a system in accordance with an embodiment of the present invention. As shown in FIG. 1, system 100 may include various components, including a processor 110 which as shown is a multicore processor. Processor 110 may be coupled to a power supply 150 via an external voltage regulator 160, which may perform a first voltage conversion to provide a primary regulated voltage to processor 110.

As seen, processor 110 may be a single die processor including multiple cores $120_a$-$120_n$. In addition, each core may be associated with an individual voltage regulator $125_a$-$125_n$. Accordingly, a fully integrated voltage regulator (FIVR) implementation may be provided to allow for fine-grained control of voltage and thus power and performance of each individual core. As such, each core can operate at an independent voltage and frequency, enabling great flexibility and affording wide opportunities for balancing power consumption with performance. As further seen, each core 120 can include at least one event counter $122_0$-$122_n$ to count certain events occurring on the core, such as instructions that use certain core circuitry (e.g., high power circuitry). This event information can be used to provide sensor information for a digital power meter in accordance with an embodiment of the present invention. Note that in some embodiments, the cores themselves may contain a digital power meter to use this information to generate a power consumption level for the core, and communicate this information to a power control unit described below.

Also although only a single event counter per core is shown for ease of illustration, understand that the scope of the present invention is not limited in this regard. For example, in other implementations of a number of event counters can be present per core. Each counter can be configured to count a number of instructions executed of a given type in the corresponding core. For example, all instructions of an instruction set architecture (ISA) can be associated with one of these counters, where instructions of roughly the same power consumption level (e.g., due to the units of the core used for such instruction's execution) can be associated or bucketed with the same counter. In this way, a relatively accurate measure of actual power consumption based on the instructions being executed in the cores can be achieved. In one embodiment, each of these counters may be associated with a given weight value, generally corresponding to its relative power consumption level. Thus in one embodiment, a digital power meter (DPM) can operate based on counting events, assigning an energy weight to each event, and scaling for temperature. The rate at which various events occur is an indicator of the dynamic power consumption of the processor.

Further understand that instead of having an internal (to the core) digital power meter, instead the weighted count information from each of the event counters (of each core) can be provided to logic of a power control unit that can perform digital power measurements based on this information. In addition, this power controller-based digital power meter can further receive information from other portions of a processor such as uncore or system agent circuitry, interface circuitry, interconnect circuitry and so forth. Based on all such information, this digital power meter can generate a relatively accurate measure of power consumption. Note that for the system agent or uncore circuitry, the information may be associated with cache accesses. For interconnect circuitry, relative bandwidth may be used as an indication of power consumption. Similarly, for interface circuitry, a measure of the amount of data packets sent and received can be a good proxy for power consumption. While such a digital power meter can be relatively accurate across a full load line of the processor, it can be very difficult to tune the meter appropriately for the various operations and events occurring within the processor. Accordingly, a hybrid power meter in accordance with an embodiment of the present invention can improve the accuracy without the need for more complex tuning of a digital power meter.

Still referring to FIG. 1, additional components may be present within the processor including an input/output interface 132, another interface 134, and an integrated memory controller 136. As seen, each of these components may be powered by another integrated voltage regulator $125_x$. In one embodiment, interface 132 may be in accordance with the Intel® Quick Path Interconnect (QPI) protocol, which provides for point-to-point (PtP) links in a cache coherent protocol that includes multiple layers including a physical layer, a link layer and a protocol layer. In turn, interface 134 may be in accordance with a Peripheral Component Interconnect Express (PCIe™) specification, e.g., the PCI Express™ Specification Base Specification version 2.0 (published Jan. 17, 2007).

Also shown is a power control unit (PCU) 138, which may include hardware, software and firmware to perform power management operations with regard to processor 110. In various embodiments, PCU 138 may include logic to perform digital power measurements, as described above. In addition, PCU 138 may include logic to perform hybrid power measurements in accordance with an embodiment of the present invention. Furthermore, PCU 138 may be coupled via a dedicated interface to external voltage regulator 160. In this way, PCU 138 can instruct the voltage regulator to provide a requested regulated voltage to the processor. In addition, voltage regulator 160 can provide information regarding its current delivery to the processor. In different implementations, voltage regulator 160 can store this information in a register of the voltage regulator that the PCU accesses. Or a current sensor, located either in voltage regulator 160 or on the path between voltage regulator 160 and PCU 138 can provide this information. This current information can be used by power meter logic of PCU 138 to generate a power consumption level based on this current delivery. Thus a voltage regulator-based current sensor can directly measure the current supplied by voltage regulator 160 to the processor. When multiplied by the supply voltage, this provides a measurement of processor power consumption.

As will be described below, logic within PCU 138 can be used to both calculate power consumption levels in multiple manners, including as described above as well as possibly in other manners and then, using a hybrid power measurement logic in accordance with an embodiment of the present invention, determine a hybrid power consumption level based on a combination of these individual power consumption levels.

While not shown for ease of illustration, understand that additional components may be present within processor 110 such as uncore logic, and other components such as internal memories, e.g., one or more levels of a cache memory hierarchy and so forth. Furthermore, while shown in the implementation of FIG. 1 with an integrated voltage regulator, embodiments are not so limited.

Although the following embodiments are described with reference to energy conservation and energy efficiency in specific integrated circuits, such as in computing platforms or processors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to any particular type of computer systems, and may be also used in other devices, such as handheld devices, systems on chip (SoCs), and embedded applications. Some examples of handheld devices include cellular phones, Internet protocol devices, digital cameras, personal digital assistants (PDAs), and handheld PCs. Embedded applications typically include a microcontroller, a digital signal processor (DSP), network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future, such as for power conservation and energy efficiency in products that encompass a large portion of the US economy.

Figure 2:
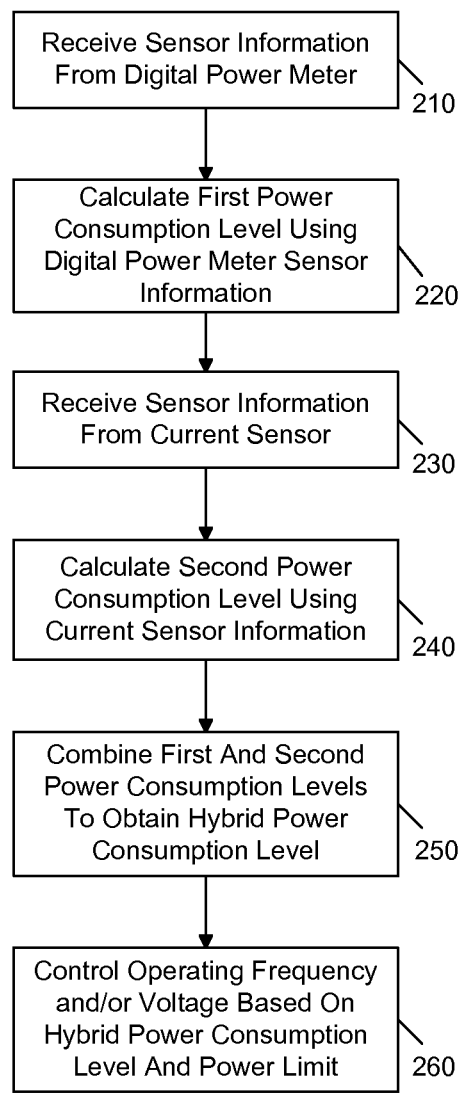
FIG. 2 is a flow diagram of a method in accordance with an embodiment of the present invention.

Referring now to FIG. 2, shown is a flow diagram of a method in accordance with an embodiment of the present invention. As shown in FIG. 2, method 200 can be implemented by logic of a PCU. More specifically, method 200 can be implemented by hybrid power measurement logic of a PCU that can receive and process information from multiple power sensors.

As seen in FIG. 2, method 200 may begin by receiving sensor information from a digital power meter (block 210).

As described above, in some embodiments at least portions of this digital power meter can be implemented within the PCU. From this sensor information, a first power consumption level of the processor can be calculated (block 220). For example, the logic can calculate a power consumption level based on the sensor information. As an example, this digital power meter can provide various information such as an indication of events occurring on various cores (e.g., instructions bucketed into different counters, which are weighted according to their relative power consumption) and other circuitry (e.g., as determined by cache activity, interconnect bandwidth, interface activity and so forth) of the processor. From this, a first power consumption level can be calculated. Note that in other embodiments, the first power consumption level can be received from the digital power meter itself.

Still referring to FIG. 2, similarly sensor information can be obtained from a current sensor such as a sensor that measures the current supplied by a voltage regulator to the processor (block 230). Different implementations of this current sensor may be present, from internal hardware of an external voltage regulator that provides power to the processor, to a current sensing circuit located in a path from the voltage regulator to the processor (and possibly within the processor itself). From this sensor information, control passes to block 240 where a second power consumption level can be calculated using this current sensor information. In one embodiment, the calculation may be implemented by multiplying the measured current by the supply voltage and thus a power consumption level corresponding to: P=IV, can be determined.

As further shown in FIG. 2, control next passes to block 250 where the first and second power consumption levels can be combined to obtain a hybrid power consumption level. As will be described further below, different manners of combining these different power consumption levels can occur. The different manners can range from using both of the power levels, e.g., according to scaled values, selecting a particular one of the power consumption levels based on a load level of the processor, or other such combinations.

Finally, control passes to block 260 where an operating frequency and/or voltage of the processor can be controlled based on this hybrid power consumption level and a power limit for the processor. As an example, typical processors can have a thermal design power (TDP) that corresponds to a maximum power dissipation that the processor can output (that can be handled by a cooling system). Using this as a maximum value and understanding a present loading of the processor and thus a current power consumption level (namely this hybrid power consumption level), in addition to obtaining a more accurate power measurement regardless of where on the load line the processor is executing, it may be possible to increase the operating frequency and/or voltage to thus obtain greater performance while remaining within the power budget, namely the TDP. Although shown at this high level in the embodiment of FIG. 2, understand the scope of the present invention is not limited in this regard.

Figure 3:
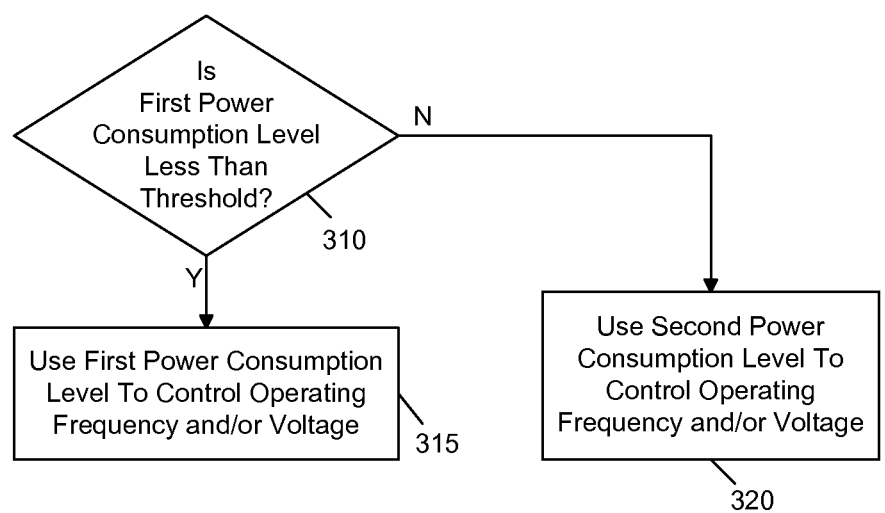
FIG. 3 is a flow diagram of combining multiple power consumption level calculations in accordance with one embodiment of the present invention.

As discussed, in different embodiments different manners of combining the power consumption levels determined by the different sensors can occur. Referring now to FIG. 3, shown is a flow diagram of one embodiment of combining multiple power consumption level calculations in accordance with an embodiment of the present invention. As seen in FIG. 3, method 300 may begin by determining whether the first power consumption level (which as discussed above is generated from sensor information received from a digital power meter) is less than a first threshold. If so, this is an indication that the processor is operating at a low load, meaning that relatively low processor utilization is occurring (e.g., as a relatively low number of instructions per cycle are being executed). At such low loads the digital power meter may provide a more accurate measure of processor power consumption than other techniques. Accordingly, control passes in FIG. 3 to block 315 where this first power consumption level can be used to control operating frequency and/or voltage.

If instead this first power consumption level is greater than the threshold, control passes to block 320 where instead the second power consumption level can be used to control operating frequency and/or voltage, as a current-based sensor may be more accurate at higher load levels. Although the scope of the present invention is not limited in this regard in some embodiments this threshold level may correspond to a load level of the processor between approximately 40 and 60% of a processor utilization, e.g., corresponding to roughly half of a TDP value of the processor.

Still other manners of combining power consumption levels determined by multiple power sensors can occur. As an example, a correlation-based combination can occur. In this way, one of the power consumption levels can be used to apply a correction factor to the other power consumption level. Assume for example given that a DPM may be accurate at low loads and a current sensor method is more accurate at higher loads, a correlation factor can be computed by executing a low power load and obtaining sensor information, and then executing a high power load and obtaining sensor information.

Figure 4:
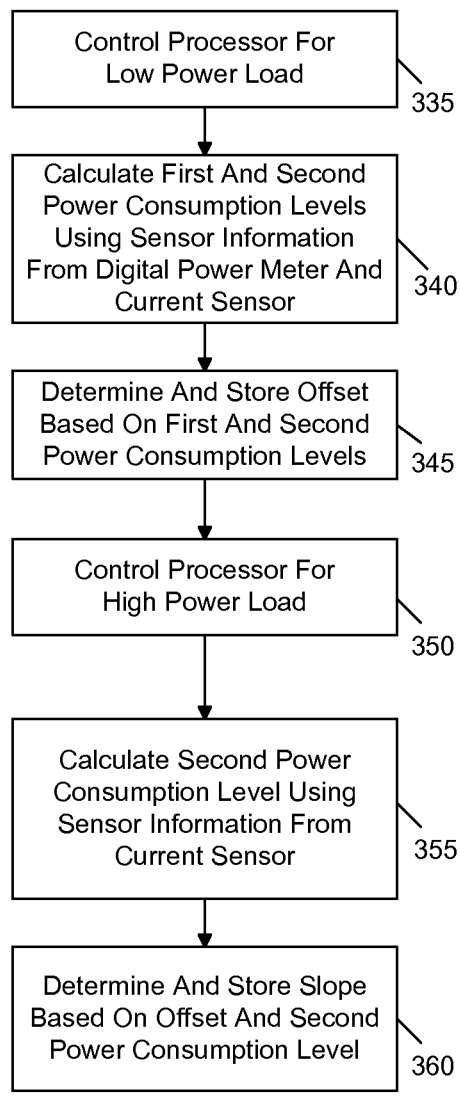
FIG. 4 is a flow diagram of a method for performing a correlation-based combination of multiple power sensors in accordance with an embodiment of the present invention.

Referring now to FIG. 4, shown is a flow diagram of a method for performing a correlation-based combination of multiple power sensors in accordance with an embodiment of the present invention. As shown in FIG. 4, method 330 can begin by controlling a processor for a low power load (block 335). In one embodiment, this control operation can occur during a boot process in which a predetermined load is executed on the processor. During execution of this load, control passes to block 340 where the first and second power consumption levels can be calculated using sensor information from the digital power meter and the current sensor. In other implementations, rather than executing a low power load, which can be a predetermined load during a boot process, instead the PCU can control the processor to be in a predetermined low power state, e.g., by controlling the cores and other circuitry of the processor accordingly to thus obtain sensor information while the processor is in this low load state. In any event, calculations can occur as discussed above in FIG. 2, in one embodiment. Next an offset can be determined and stored based on these power consumption levels (block 345). In one embodiment, this offset can be determined as follows:

$$\text{Offset} = \text{First Power Consumption Level} - \text{Second Power Consumption Level}.$$

In one embodiment, this offset corresponding to the difference between the power consumption levels can be stored in a power management storage, e.g., present in a PCU. Although described as being stored within a storage of the PCU, understand the scope of the present invention is not limited in this regard. For example, in other implementations, this offset value (in other calibration values discussed further below) can be stored in a non-volatile storage, e.g., a non-volatile storage associated with the basic input/output system (BIOS).

Still referring to FIG. 4, next control passes to block 350 where the processor can be controlled for a high power load. During execution of this high power load, which again can occur during a boot process and may correspond to a predetermined load, at least the second power consumption level can be calculated using the sensor information from the current sensor (block 355). Control next passes to block 360 where a slope can be determined and stored based on the offset and the second power consumption level (namely the power consumption level obtained from the current sensor). In one embodiment, the slope can be determined according to:

$$\text{Slope} = (\text{Second Power Consumption Level} - \text{Offset})/\text{Second Power Consumption Level}.$$ Note that this slope can also be stored in the power management storage.

These operations as discussed above in FIG. 4 can be performed during a boot process. Or they can be performed under control of the PCU, e.g., when a different temperature level of the processor is reached (e.g., when a processor temperature exceeds a previous temperature by a threshold amount), responsive to a user request, or at another interval. After obtaining of these slope and offset values, the values can be used during normal operation.

Figure 5:
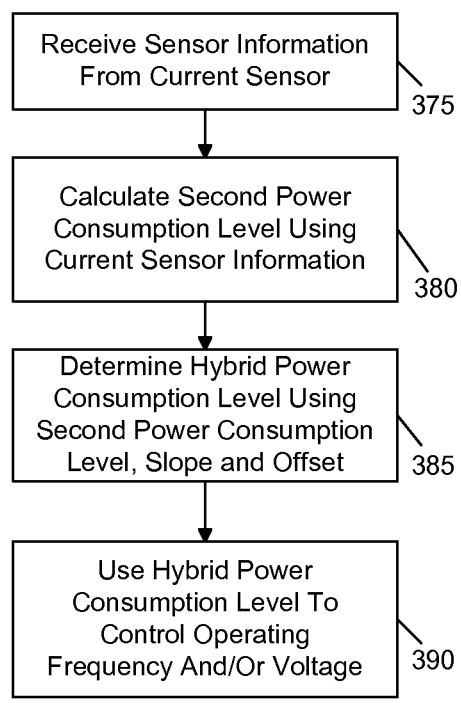
FIG. 5 is a flow diagram of a method of performing power measurements in accordance with another embodiment of the present invention.

Referring now to FIG. 5, shown is a flow diagram of a method of performing power measurements in accordance with another embodiment of the present invention. As shown in FIG. 5, method 370 may be used to measure power consumption during normal operation using these stored values. As seen, method 370 may begin by receiving sensor information from a current sensor (block 375). Control next passes to block 380 where a second power consumption level can be calculated using this current sensor information. Control then passes to block 385 where a hybrid power consumption level can be determined using this second power consumption level, and the slope and offset. In one embodiment, this hybrid power consumption level can be determined according to:

$$\text{Hybrid} = \text{Second Power Consumption Level} \times \text{Slope} + \text{Offset}.$$

Accordingly, a hybrid power consumption level can be determined and can be used at block 390 to control the operating frequency and/or voltage of the processor. Although shown at this high level in the embodiment of FIGS. 4 and 5, understand the scope of the present invention is not limited in this regard. For example, in another implementation, the calculations can be performed to enable applying a correction factor to the power consumption level determined according to the digital power meter, where the correction factors are obtained using the power consumption levels from the digital power meter and the current sensor. And furthermore understand that different equations for generating the correction values and the hybrid power consumption level can occur in other embodiments.

Figure 6:
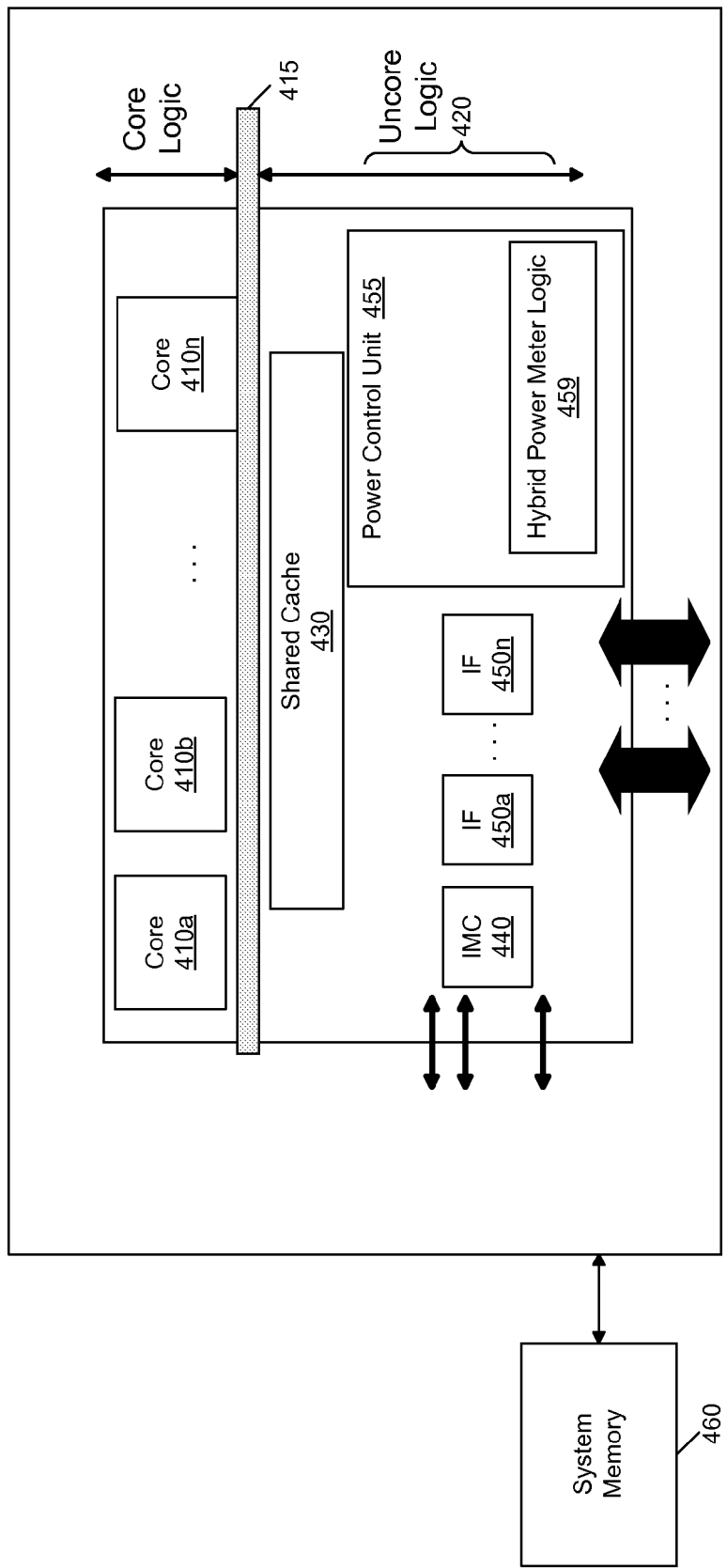
FIG. 6 is a block diagram of a processor in accordance with an embodiment of the present invention.

Embodiments can be implemented in processors for various markets including server processors, desktop processors, mobile processors and so forth. Referring now to FIG. 6, shown is a block diagram of a processor in accordance with an embodiment of the present invention. As shown in FIG. 6, processor 400 may be a multicore processor including a plurality of cores $410_a$-$410_n$. In one embodiment, each such core may be of an independent power domain and can be configured to enter and exit active states and/or maximum performance states based on workload. The various cores may be coupled via an interconnect 415 to a system agent or uncore 420 that includes various components. As seen, the uncore 420 may include a shared cache 430 which may be a last level cache. In addition, the uncore may include an integrated memory controller 440, various interfaces 450 and a power control unit 455.

In various embodiments, power control unit 455 may include a hybrid power meter logic 459 in accordance with an embodiment of the present invention. As described above, this power meter can receive sensor information from different power sensors, including a digital power meter and an analog or current-based sensor. Note that different implementations are possible, such as a hybrid power meter that receives sensor information from each of multiple pairs of such sensors, e.g., where each pair is associated with a given core. Or, digital power meters may be present in the individual cores (and other processor circuitry) and instead a single current sensor-based power meter may be present in the processor. Variations on these implementations are of course also possible.

Based on the information received from these various sensors, hybrid power meter logic 459 can combine the sensor information in a selected manner to obtain a very accurate measure of power consumption in the processor. In this way, processor 400 can be configured to operate with very little guardband from a maximum power consumption level, e.g., a TDP level of the processor.

With further reference to FIG. 6, processor 400 may communicate with a system memory 460, e.g., via a memory bus. In addition, by interfaces 450, connection can be made to various off-chip components such as peripheral devices, mass storage and so forth. While shown with this particular implementation in the embodiment of FIG. 6, the scope of the present invention is not limited in this regard.

Figure 7:
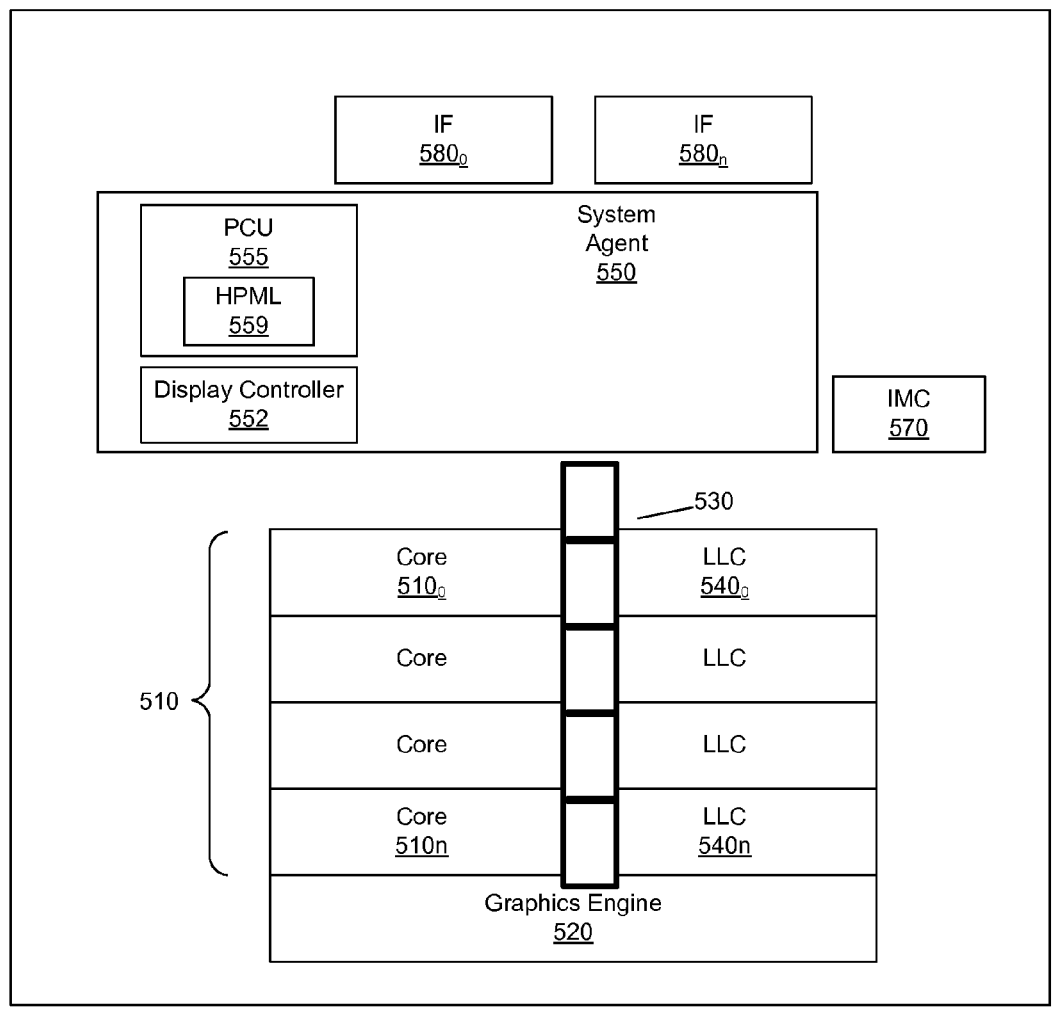
FIG. 7 is a block diagram of a multi-domain processor in accordance with another embodiment of the present invention.

Referring now to FIG. 7, shown is a block diagram of a multi-domain processor in accordance with another embodiment of the present invention. As shown in the embodiment of FIG. 7, processor 500 includes multiple domains. Specifically, a core domain 510 can include a plurality of cores $510_0$-$510_n$, a graphics domain 520 can include one or more graphics engines, and a system agent domain 550 may further be present. In some embodiments, system agent domain 550 may execute at an independent frequency than the core domain and may remain powered on at all times to handle power control events and power management such that domains 510 and 520 can be controlled to dynamically enter into and exit low power states. Each of domains 510 and 520 may operate at different voltage and/or power. Note that while only shown with three domains, understand the scope of the present invention is not limited in this regard and additional domains can be present in other embodiments. For example, multiple core domains may be present each including at least one core.

In general, each core 510 may further include low level caches in addition to various execution units and additional processing elements. In turn, the various cores may be coupled to each other and to a shared cache memory formed of a plurality of units of a last level cache (LLC) $540_0$-$540_n$. In various embodiments, LLC 540 may be shared amongst the cores and the graphics engine, as well as various media processing circuitry. As seen, a ring interconnect 530 thus couples the cores together, and provides interconnection between the cores, graphics domain 520 and system agent circuitry 550. In one embodiment, interconnect 530 can be part of the core domain. However in other embodiments the ring interconnect can be of its own domain.

As further seen, system agent domain 550 may include display controller 552 which may provide control of and an interface to an associated display. As further seen, system agent domain 550 may include a power control unit 555 which can include a hybrid power meter logic 559 in accordance with an embodiment of the present invention to dynamically and accurately measure power consumption in the processor to enable greater processor performance in view of greater available processing power. In various embodiments, this logic may execute the algorithms described above in one or more of FIGS. 2-5.

As further seen in FIG. 7, processor 500 can further include an integrated memory controller (IMC) 570 that can provide for an interface to a system memory, such as a dynamic random access memory (DRAM). Multiple interfaces $580_0$-$580_n$ may be present to enable interconnection between the processor and other circuitry. For example, in one embodiment at least one direct media interface (DMI) interface may be provided as well as one or more Peripheral Component Interconnect Express (PCI Express™ (PCIe™)) interfaces. Still further, to provide for communications between other agents such as additional processors or other circuitry, one or more interfaces in accordance with an Intel® Quick Path Interconnect (QPI) protocol may also be provided. Although shown at this high level in the embodiment of FIG. 7, understand the scope of the present invention is not limited in this regard.

Figure 8:
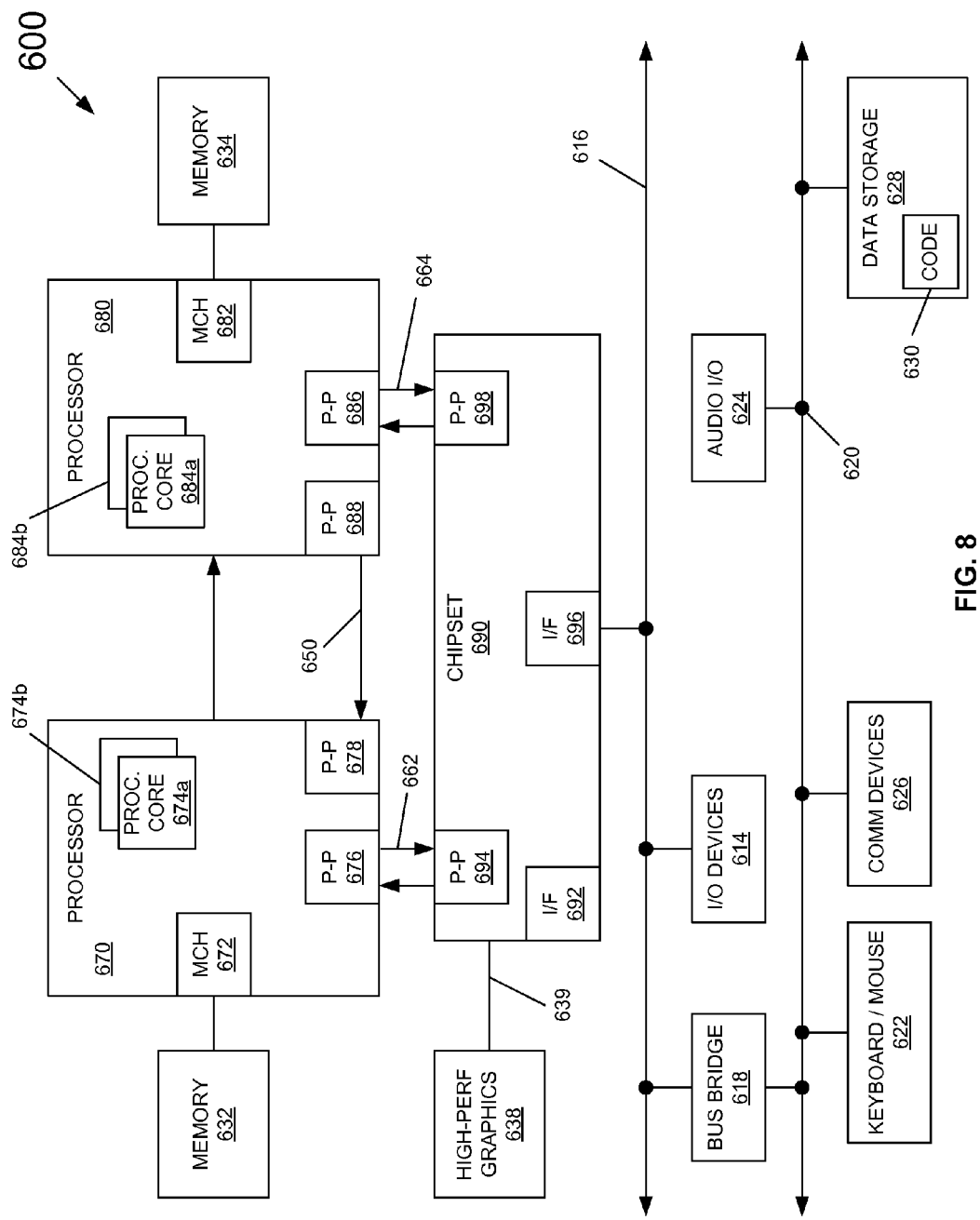
FIG. 8 is a block diagram of a system in accordance with an embodiment of the present invention.

Embodiments may be implemented in many different system types. Referring now to FIG. 8, shown is a block diagram of a system in accordance with an embodiment of the present invention. As shown in FIG. 8, multiprocessor system 600 is a point-to-point interconnect system, and includes a first processor 670 and a second processor 680 coupled via a point-to-point interconnect 650. As shown in FIG. 8, each of processors 670 and 680 may be multicore processors, including first and second processor cores (i.e., processor cores 674a and 674b and processor cores 684a and 684b), although potentially many more cores may be present in the processors. Each of the processors can include a PCU or other logic to perform hybrid power measurements, and corresponding operating frequency and/or voltage control, as described herein.

Still referring to FIG. 8, first processor 670 further includes a memory controller hub (MCH) 672 and point-to-point (P-P) interfaces 676 and 678. Similarly, second processor 680 includes a MCH 682 and P-P interfaces 686 and 688. As shown in FIG. 8, MCH's 672 and 682 couple the processors to respective memories, namely a memory 632 and a memory 634, which may be portions of system memory (e.g., DRAM) locally attached to the respective processors. First processor 670 and second processor 680 may be coupled to a chipset 690 via P-P interconnects 652 and 654, respectively. As shown in FIG. 8, chipset 690 includes P-P interfaces 694 and 698.

Furthermore, chipset 690 includes an interface 692 to couple chipset 690 with a high performance graphics engine 638, by a P-P interconnect 639. In turn, chipset 690 may be coupled to a first bus 616 via an interface 696. As shown in FIG. 8, various input/output (I/O) devices 614 may be coupled to first bus 616, along with a bus bridge 618 which couples first bus 616 to a second bus 620. Various devices may be coupled to second bus 620 including, for example, a keyboard/mouse 622, communication devices 626 and a data storage unit 628 such as a disk drive or other mass storage device which may include code 630, in one embodiment. Further, an audio I/O 624 may be coupled to second bus 620. Embodiments can be incorporated into other types of systems including mobile devices such as a smart cellular telephone, tablet computer, netbook, ultrabook, or so forth.

Figure 9:
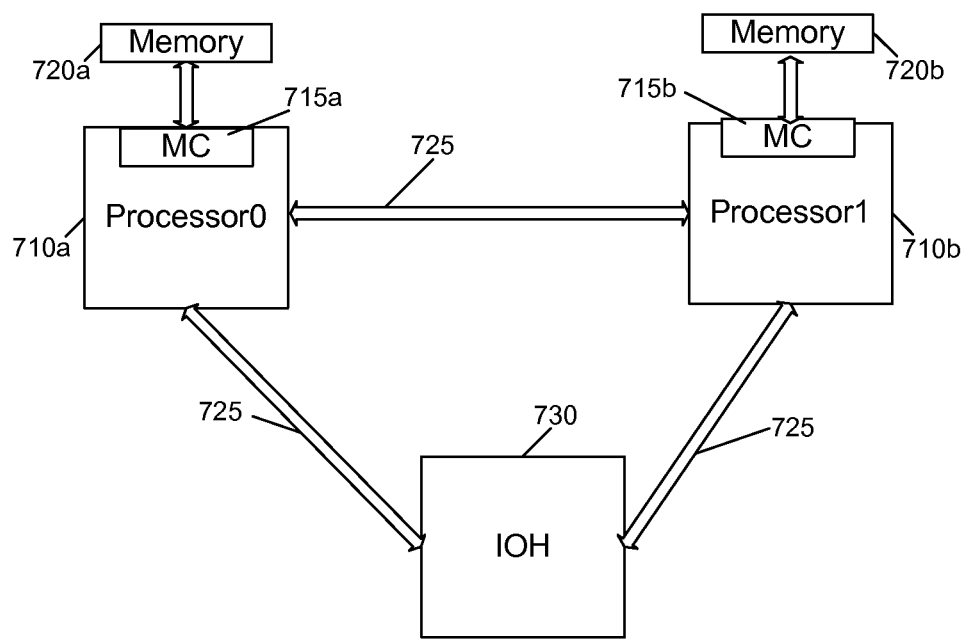
FIG. 9 is a block diagram of a multiprocessor system with a point-to-point (PtP) interconnect in accordance with one embodiment of the present invention.

FIG. 9 is a block diagram of a system coupled with point-to-point (PtP) system interconnects in accordance with a given cache coherence protocol using QPI links as the system interconnect. In the embodiment shown, each processor 710 is coupled to two PtP links 725 and includes one instance of an integrated memory controller 715 that in turn is coupled to a corresponding local portion of a system memory 720. Each processor can perform hybrid power metering and corresponding power management policies as described herein. The processors are connected to an input/output hub (IOH) 730 using one link and the remaining link is used to connect the two processors.

Figure 10:
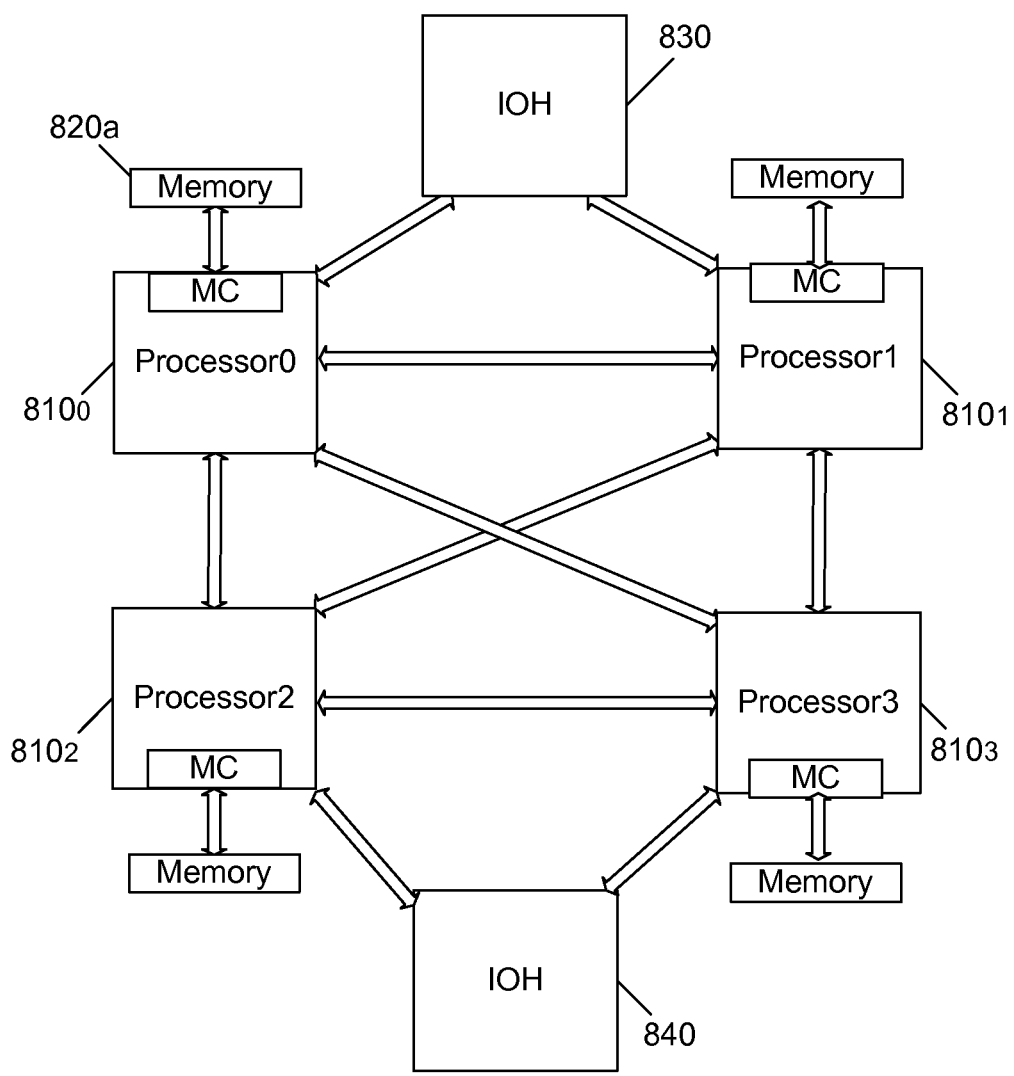
FIG. 10 is a block diagram of a partially connected quad processor system in accordance with one embodiment of the present invention.

Referring now to FIG. 10, shown is a block diagram of a system in accordance with another embodiment of the present invention. As shown in FIG. 10, system 800 may be a partially connected quad processor system in which each processor 810 (each of which may be multicore multi-domain processors) is coupled to each other processor via a PtP link and is coupled to a local portion of memory (e.g., dynamic random access memory (DRAM)) 820 via a memory interconnect coupled to an integrated memory controller 815 of the corresponding processor. In the partially connected system of FIG. 10, note the presence of two IOHs 830 and 840 such that processors $810_0$ and $810_1$ are directly coupled to IOH 830 and similarly processors $810_2$ and $810_3$ are directly coupled to IOH 840.

In one aspect, a processor includes multiple cores to independently execute instructions, a first sensor to measure a first power consumption level of the processor based at least in part on events occurring on the cores, and a hybrid logic to combine the first power consumption level with a second power consumption level determined based on a dynamic current provided to the processor. To this end, a power controller included in or coupled to the processor may control at least one of an operating frequency and a voltage of the processor based on this combined consumption level and a power limit of the processor.

In another aspect, a method includes receiving, in a first logic of a processor, sensor information from a digital power meter of the processor, and calculating a first power consumption level of the processor using this sensor information; receiving, in the logic, sensor information from a current sensor configured to measure a current delivered by a voltage regulator coupled to the processor and calculating a second power consumption level of the processor using the sensor information from the current sensor; and combining, in the first logic, the first and second power consumption levels to obtain a hybrid power consumption level of the processor. From this information and a power limit of the processor, an operating frequency and/or voltage of the processor can be controlled.

Yet another aspect includes a system with a multicore processor and a system memory. The cores may each include one or more event counters to count events occurring on the core, a digital power meter to calculate a first power consumption level based on the count information, a second power meter to calculate a second power consumption level based on a current delivered to the processor from a voltage regulator, and a power controller including logic to generate a combined power consumption level of the processor using the first and second power consumption levels.

In another aspect, a processor means includes execution means each for independently executing instructions, sensor means for measuring a first power consumption level of the processor means based at least in part on events occurring on the execution means, and means for combining the first power consumption level and a second power consumption level of the processor means determined based on a dynamic current provided to the processor means. In turn an operating frequency and/or voltage of the processor means can be controlled via a controller means based on the combined first and second power consumption levels and a power limit of the processor means.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A processor comprising:
a plurality of cores to independently execute instructions;
a first sensor to measure a first power consumption level of the processor based at least in part on a plurality of events that occur on the plurality of cores; and
a first logic to combine the first power consumption level and a second power consumption level of the processor determined based on a value of a dynamic current provided to the processor, wherein the first logic is to execute a low power load on the processor and calculate the first and second power consumption levels using sensor information from the first sensor and the dynamic current, respectively, determine and store an offset based on the first and second power consumption levels, execute a high power load on the processor and calculate the second power consumption level using the dynamic current, determine and store a slope based on the offset and the calculated second power consumption level, and determine the combined power consumption level using another second power consumption level, the slope and the offset.

2. The processor of claim 1, further comprising a power controller to control at least one of an operating frequency and a voltage of the processor based on the combined first and second power consumption levels and a power limit of the processor.

3. The processor of claim 1, wherein the first sensor comprises a logic to receive counter information from a plurality of event counters associated with each of the plurality of cores and to measure the first power consumption level based on the counter information.

4. The processor of claim 1, wherein the first logic is to combine the first power consumption level and the second power consumption level by:
generation of a first correction factor using the first power consumption level and the second power consumption level; and
generation of a second correction factor using the second power consumption level and the first correction factor.

5. The processor of claim 4, wherein the first logic is to determine the combined power consumption level using the second power consumption level and the first and second correction factors.

6. A method comprising:
receiving, in a first logic of a processor, sensor information from a digital power meter of the processor, and calculating a first power consumption level of the processor using the sensor information from the digital power meter;
receiving, in the first logic, sensor information from a current sensor adapted to measure a current delivered by a voltage regulator coupled to the processor, and calculating a second power consumption level of the processor using the sensor information from the current sensor, including:
executing a low power load on the processor and calculating the first and second power consumption levels using the sensor information from the digital power meter and the sensor information from the current sensor, respectively, and determining and storing an offset based on the first and second power consumption levels; and
executing a high power load on the processor and calculating the second power consumption level using the sensor information from the current sensor, and determining and storing a slope based on the offset and the calculated second power consumption level; and
combining, in the first logic, the first power consumption level and another second power consumption level to obtain a hybrid power consumption level of the processor, using the another second power consumption level, the slope and the offset.

7. The method of claim 6, further comprising controlling at least one of an operating frequency and a voltage of the processor based on the hybrid power consumption level and a power limit of the processor.

8. The method of claim 7, wherein combining the first and second power consumption levels comprises:
if the first power consumption level is less than a threshold, using the first power consumption level to control the at least one of the operating frequency and the voltage; and
otherwise, using the second power consumption level to control the at least one of the operating frequency and the voltage.

9. The method of claim 7, wherein combining the first and second power consumption levels comprises:
generating a first correction factor using the first power consumption level and the second power consumption level; and
generating a second correction factor using the second power consumption level and the first correction factor.

10. The method of claim 9, further comprising determining the hybrid power consumption level using the second power consumption level and the first and second correction factors.

11. The method of claim 10, further comprising controlling at least one of an operating frequency and a voltage of the processor based on the hybrid power consumption level.

12. A system comprising:
  a multicore processor including a plurality of cores to independently execute instructions, each of the plurality of cores including at least one event counter to count events that occur on the core, a digital power meter to calculate a first power consumption level based on information from the event counters, a second power meter to calculate a second power consumption level based on information regarding a current delivered to the multicore processor from a voltage regulator, and a power controller including a first logic to generate a combined power consumption level of the multicore processor using the first and second power consumption levels, wherein the first logic is to cause a low power load level to occur on the multicore processor and calculate the first and second power consumption levels during the low power load level, determine and store an offset based on first and second power consumption levels, cause a high power load level to occur on the multicore processor and calculate the second power consumption level during the high power load level, determine and store a slope based on the offset and the calculated second power consumption level, and determine the combined power consumption level using another second power consumption level, the slope and the offset;
  the voltage regulator coupled to the multicore processor to provide a regulated voltage to the multicore processor, the voltage regulator including a current sensor to provide the information regarding the current delivered to the multicore processor; and
  a dynamic random access memory (DRAM) coupled to the multicore processor.

13. The system of claim 12, wherein the first logic is to receive the second power consumption level during normal operation of the system.

14. A processor comprising:
  a plurality of execution units each to independently execute instructions;
  a first sensor to measure a first power consumption level of the processor based at least in part on a plurality of events that occur on the plurality of execution units;
  a logic to combine the first power consumption level and a second power consumption level of the processor determined based on information regarding a dynamic current provided to the processor, the information obtained from a current sensor coupled to the processor to measure the dynamic current, wherein the logic is to:
  cause a low power load level to occur on the processor, calculate the first and second power consumption levels during the low power load level, and determine and store an offset based on first and second power consumption levels; and
  cause a high power load level to occur on the processor, calculate the second power consumption level during the high power load level, determine and store a slope based on the offset and the calculated second power consumption level, and determine a combined power consumption level using another second power consumption level, the slope and the offset.

15. The processor of claim 14, further comprising a controller to control at least one of an operating frequency and a voltage of the processor based on the combined first and second power consumption levels and a power limit of the processor.

* * * * *